United States Patent [19]
Miyake et al.

[11] Patent Number: 5,274,250
[45] Date of Patent: Dec. 28, 1993

[54] COLOR IMAGE SENSOR WITH LIGHT-SHIELDING LAYER

[75] Inventors: Hiroyuki Miyake; Hisao Ito, both of Kanagawa, Japan

[73] Assignee: Fuji Xerox Co., Ltd., Japan

[21] Appl. No.: 912,507

[22] Filed: Jul. 10, 1992

[30] Foreign Application Priority Data

Jul. 12, 1991 [JP] Japan ............ 3-197281
May 8, 1992 [JP] Japan ............ 4-142018

[51] Int. Cl.⁵ .................... H01L 27/14
[52] U.S. Cl. ............ 257/59; 257/294; 257/435; 257/440; 257/443
[58] Field of Search ........... 257/440, 432, 294, 443, 257/435, 292, 291, 293, 232, 233, 59

[56] References Cited

U.S. PATENT DOCUMENTS

| | | |
|---|---|---|
| 3,969,751 | 7/1976 | Drukaroff et al. ............ 257/435 |
| 4,412,236 | 10/1983 | Sasano et al. ............ 257/294 |
| 4,553,153 | 11/1985 | McColgin et al. ............ 257/435 |

FOREIGN PATENT DOCUMENTS

| | | |
|---|---|---|
| 59-36961 | 2/1984 | Japan ............ 257/440 |
| 63-170959 | 7/1988 | Japan ............ 257/440 |
| 1-147863 | 6/1989 | Japan ............ 257/294 |

OTHER PUBLICATIONS

Horii et al., "A 490×404 Element Imager for a Single-Chip Color Camera," Digest of Technical Papers, 1985 IEEE International Solid-State Circuits Conference, Feb. 1985, pp. 96-97.

*Primary Examiner*—William Mintel
*Attorney, Agent, or Firm*—Finnegan, Henderson, Farabow, Garrett & Dunner

[57] ABSTRACT

Disclosed is a color image sensor of the type that reads color images with the aid of filters that absorb light of different colors (e.g. red, green and blue) and that are provided over arrays of light-receiving devices formed in a plurality of rows on a common substrate. The color image sensor includes a substrate, light-receiving devices formed on the substrate, thin-film transistors that are connected to the light-receiving devices and that are formed on the substrate, an insulating layer that covers the thin-film transistors and the light-receiving devices, a color filter formed on the insulating layer in such a position that it covers the light-receiving devices, and a light-shielding layer formed on the insulating layer in such a position that it covers the thin-film transistors.

9 Claims, 7 Drawing Sheets

COLOR IMAGE SENSOR WITH LIGHT-SHIELDING LAYER

BACKGROUND OF THE INVENTION

This invention relates to a color image sensor of the type that reads color images with the aid of filters that absorb light of different colors (e.g. red, green and blue) and that are provided over arrays of light-receiving devices formed in a plurality of rows on a common substrate. More particularly, this invention relates to a color image sensor of high reliability that is improved in the switching characteristics of thin-film transistors.

Figure 6:
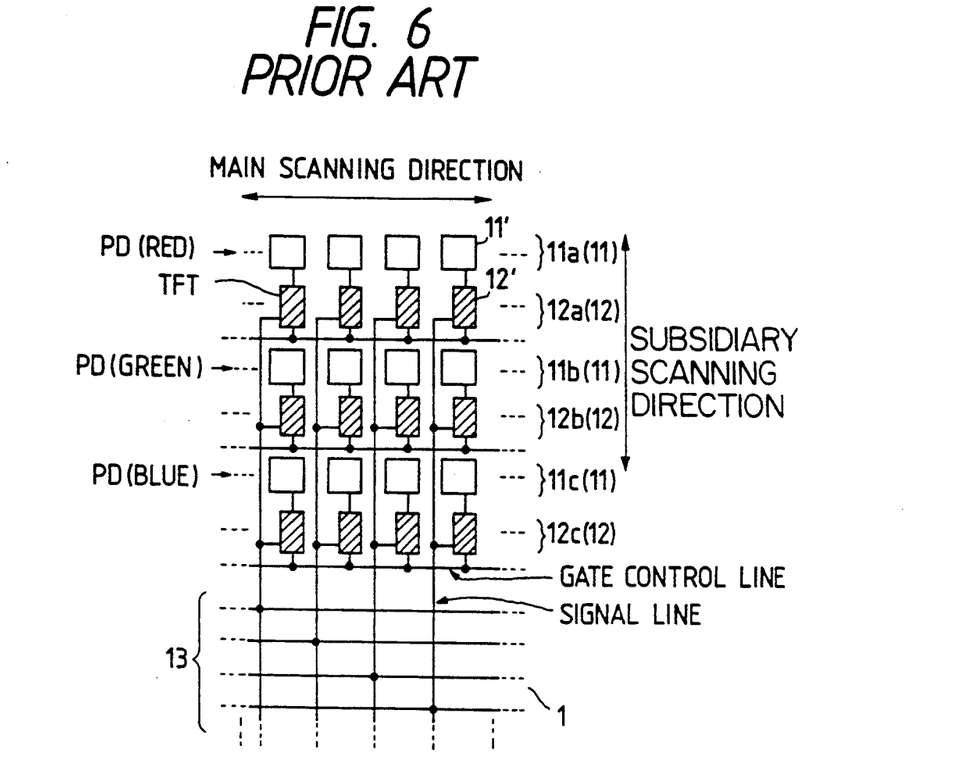
FIG. 6 is a schematic plan view of the sensor portion of a conventional color image sensor.
Figure 7:
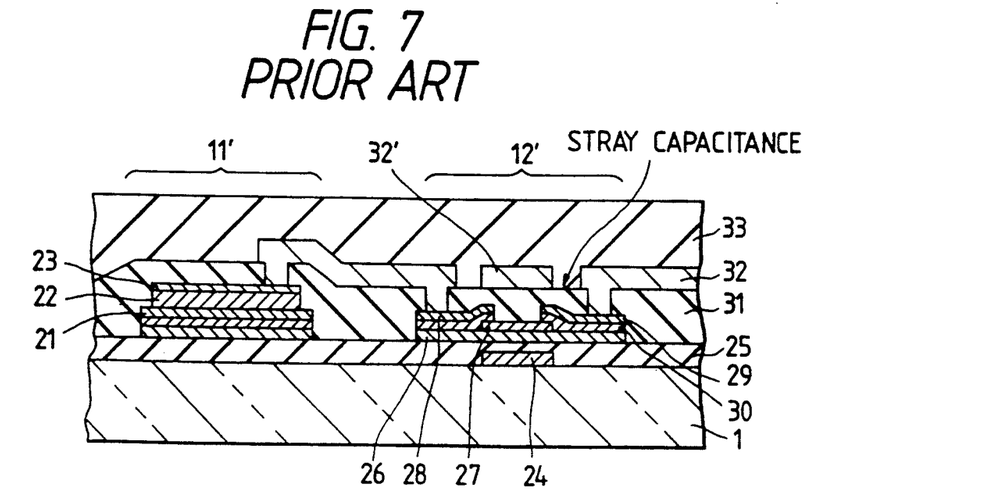
FIG. 7 is a cross-sectional explanatory view showing the sensor portion of the conventional color image sensor.

A typical example of conventional color image sensors that have arrays of light-receiving devices formed in a plurality of rows on a common substrate is shown in FIG. 6 which is a schematic plan view and in FIG. 7 which is a cross-sectional explanatory view. As shown in FIG. 6, the sensor portion comprises a substrate 1 on which arrays of light-receiving devices 11 which are assemblies of light-receiving devices 11' are formed in the main scanning direction, with the arrays 11 consisting of three arrays, 11a, 11b and 11c, which are juxtaposed parallel to one another in the subsidiary scanning direction. In the case shown, arrays 11a, 11b and 11c are adapted to read red, green and blue light, respectively. The respective light-receiving devices are connected to thin-film transistors 12' that are switching elements for transferring electric charges, so that arrays of charge transfer portions 12a, 12b and 12c are formed in correspondence to respective arrays 11a, 11b and 11c of light-receiving devices. Signal lines drawn from the charge transfer portions 12 are connected to a multilevel wiring 13.

As shown in FIG. 7, each of the light-receiving devices 11' comprises a metallic electrode 21, a photoconductive layer 22 and a transparent electrode 23 that are formed in superposition on the substrate 1 to compose a sandwich structure. The metallic electrode 21 serves as a lower common electrode and is made of a chromium (Cr) layer in strip form; the photoconductive layer 22 is made of hydrogenated amorphous silicon (a-Si:H) segmented for each light-receiving device; and the transparent electrode 23 is an upper electrode that is made of similarly segmented indium tin oxide (ITO).

As also shown in FIG. 7, each of the thin-film transistors 12' comprises a gate electrode 24, a gate insulating layer 25, a semiconductor active layer 26, a channel protective layer 27, an ohmic contact layer 30, a drain electrode 28, a source electrode 29, an inter-level insulating layer 31, a light-shielding metallic layer 32', and a wiring layer 32, and these components are assembled on the substrate 1 to form a reverse-staggered transistor. The gate electrode 24 is formed of chromium (Cr1); the gate insulating layer 25 is a silicon nitride film (SiNx) that covers the gate electrode 24; the semiconductor active layer 26 is made of hydrogenated amorphous silicon (a-Si:H) deposited over the gate insulating layer 25; the channel protective layer 27 is formed of SiNx in such a way as to be in registry with the gate electrode 24; the ohmic contact layer 30 is made of n+hydrogenated amorphous silicon (n+a-Si:H) and provided on the semiconductor active layer 26; the drain electrode 28 and the source electrode 29 are formed of chromium (Cr2) to cover the ohmic contact layer 30; the inter-level insulating layer 31 is formed of polyimide to cover the channel protective layer 27; the light-shielding metallic layer 32' is made of aluminum (Al) to shield the channel protective layer 27 from light; and the wiring layer 32 is connected to the drain electrode 28 and the source electrode 29.

Figure 8:
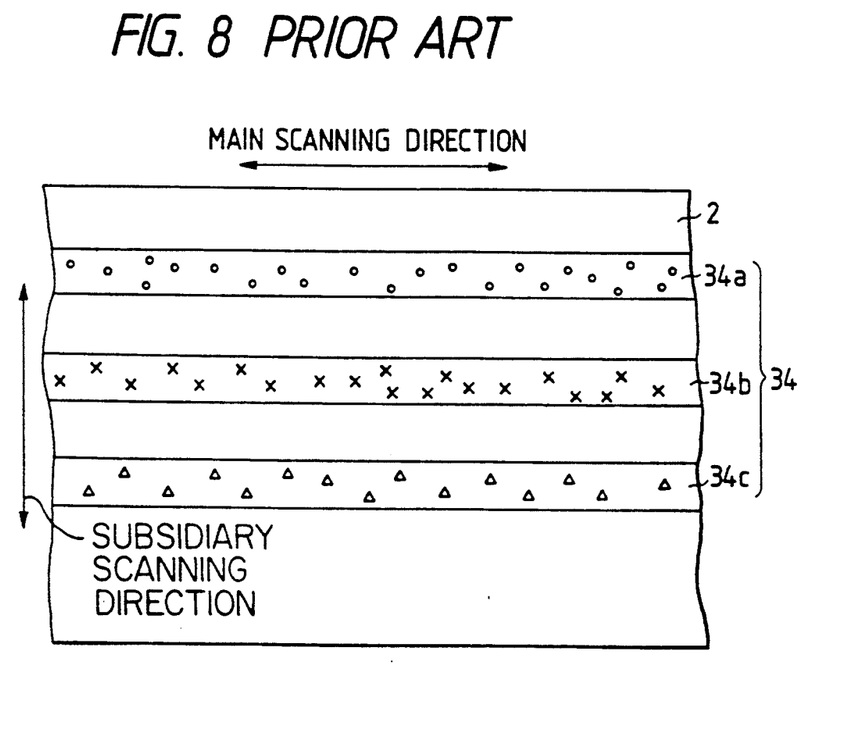
FIG. 8 is a schematic plan view showing the filter portion of the conventional color image sensor.

FIG. 8 is a schematic plan view of the filter portion of the image sensor under consideration. As shown, it comprises another transparent thin insulating substrate 2 that has color filters 34 formed thereon for performing color separation on image information. The color filters are adapted to absorb light of predetermined colors, say, red, green and blue. These filters 34 correspond to each array of light-receiving devices 11 in terms of both length and width and are formed in strip in the main scanning direction. They are arranged in three rows in the subsidiary scanning direction, i.e., color filters 34a, 34b and 34c which are associated with red, green and blue colors.

The substrates 2 and 1 are bonded to each other in such a way that the color filters 34 for different colors which are formed on the substrate 2 will come in registry with the top surfaces of the respective arrays of light-receiving devices 11 which are formed on the substrate 1 (e.g. the red color filter 34a on top of the array 11a, the green color filter 34b on top of the array 11b, and the blue color filter 34c on top of the array 11c), whereby a desired color image sensor is completed.

The color image sensor of the construction described above is operated in the following manner: when the light reflected from the document surface passes through the color filters 34, only the light of specific wavelength components that are determined by the colors of the respective filters are picked up to reach the working portions of the light-receiving devices 11', where electric charges are generated in amounts that depend on the illuminance of received light. Stated more specifically, the array 11a of light-receiving devices will respond to red light, the array 11b to green light and the array 11c to blue light, thereby producing electric charges and, as the thin-film transistors 12' are turned on or off, image information for red, green and blue colors are read sequentially over common signal lines. Image signals for individual colors are stored temporarily in a memory external to the sensor for synthesis of image data.

If the semiconductor active layer 26 in each thin-film transistor 12' is an a-Si:H layer as in the case of the conventional color image sensor described above, the photoelectric effect of the a-Si:H layer causes electric charges to be generated when the channel portion of each thin-film transistor 12' is illuminated with light and the leakage current which flows in an OFF state will increase to such an extent that the switching characteristics of the thin-film transistors will deteriorate. To avoid this problem, the light-shielding metallic layer 32' which is the same Al metallic layer as the wiring layer 32 has been formed on top of the channel of each thin-film transistor 12' as shown in FIG. 7.

However, the conventional color image sensor is already complex in structure since arrays of light-receiving devices are arranged in three rows and the respective light-receiving devices are in one-to-one correspondence with thin-film transistors as they are connected to each other. Thus, the system layout becomes more complicated if one attempts to form light-shielding metallic layers that cover the channel portions of the individual thin-film transistors. As a further problem, it is difficult to achieve interconnection in such a way as to keep the light-shielding metallic layers at a constant potential.

The use of a metal as the material of the light-shielding layers unavoidably results in a structure in which the metallic light-shielding layer is superposed on the thin-film transistor as they are separated only by an inter-level insulating layer and, hence, stray capacitance will develop between the metallic light-shielding layer and each of the drain and source electrodes of the thin-film transistor. If unwanted stray capacitance is loaded on the source electrode, the output of electric charges to common signal lines will decrease and the resulting lower sensitivity will lead to impaired performance of the image sensor.

SUMMARY OF THE INVENTION

The present invention has been accomplished under these circumstances and has an object of providing a color image sensor that is capable of shielding the channel portions of thin-film transistors from light without increasing the complexity of the layout of interconnections and other system components for keeping the light-shielding metallic layers at a constant potential, whereby the switching characteristics of the thin-film transistors are improved to insure high operational reliability.

In order to attain the above object, the present invention provides a color image sensor including a substrate; light-receiving devices formed on the substrate; thin-film transistors that are connected to the light-receiving devices and that are formed on the substrate; an insulating layer that covers the thin-film transistors and the light-receiving devices; a color filter formed on the insulating layer in such a position that it covers the light-receiving devices; and a light-shielding layer formed on the insulating layer in such a position that it covers the thin-film transistors.

DETAILED DESCRIPTION OF THE INVENTION

An embodiment of the present invention will be described hereunder with reference to accompanying drawings.

Figure 1:
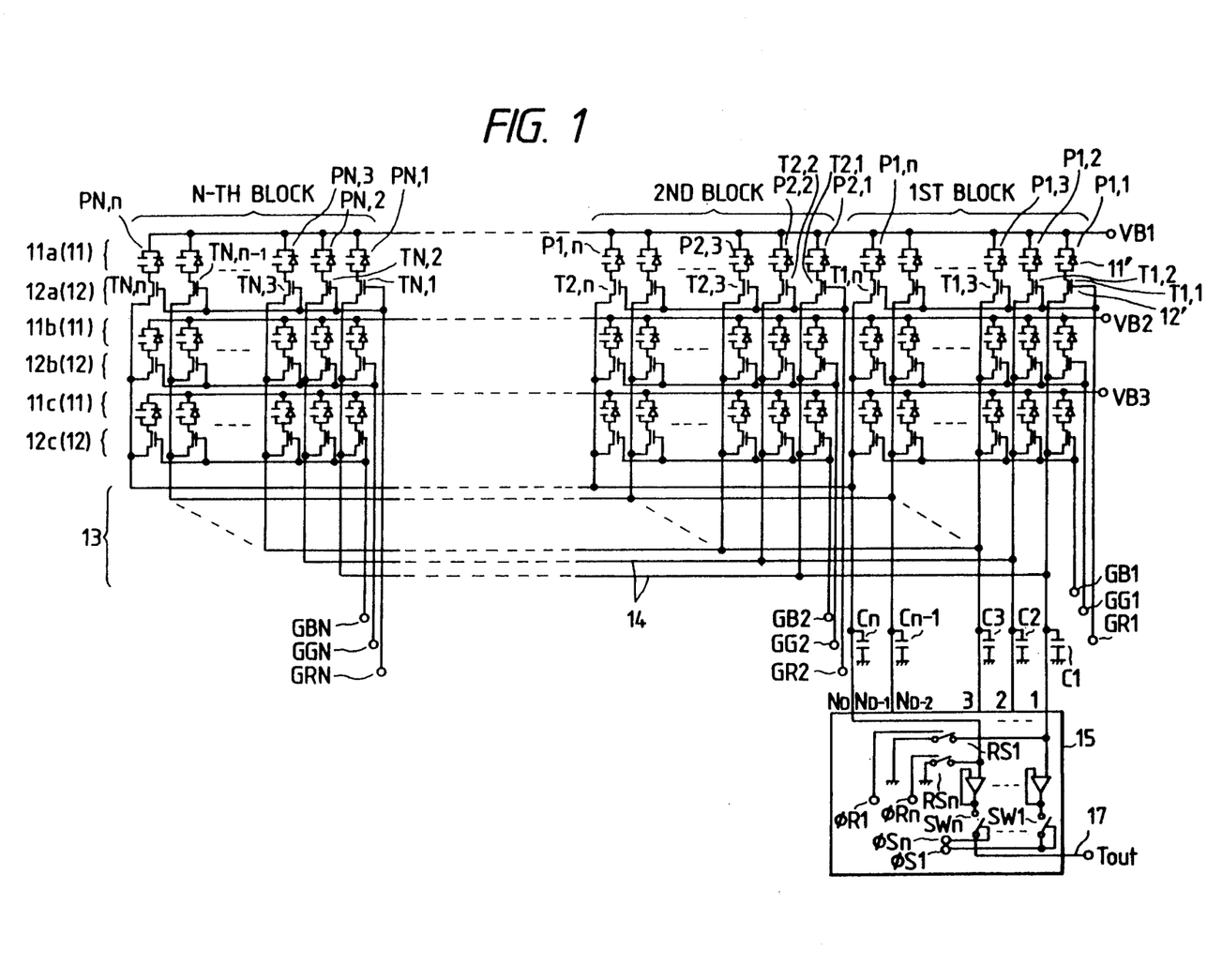
FIG. 1 is a diagram showing an equivalent circuit for a color image sensor according to an embodiment of the present invention.

FIG. 1 is a diagram showing an equivalent circuit for a color image sensor according to an embodiment of the present invention. The color image sensor has many light-receiving devices of sandwich type (photodiodes: PDs) 11' formed on an insulating substrate 1, with n PDs composing one block. N blocks of PDs form an array of light-receiving devices 11 (P1,1–PN,n), such arrays are arranged in three rows, 11a, 11b and 11c, in the subsidiary scanning direction. Thin-film transistors (T1,1–TN,n) 12' connected to the respective light-receiving devices 11' are formed in arrays that correspond to arrays 11a, 11b and 11c, thereby composing charge transfer portions 12a, 12b and 12c. In addition to these components, the color image sensor comprises a multilevel wiring 13 in a matrix form, n common signal lines 14 that extend from the charge transfer portions 12 via the multilevel wiring 13 and which correspond in number to the light-receiving devices in one block, analog switches (SW1–SWn) in a drive IC 15 to which the common signal lines 14 are connected, and load capacitors (Cl–Cn) provided on the common signal lines 14. Provided on top of the arrays of light-receiving devices 11 is another transparent insulating substrate 2 having red, green and blue filters 34a, 34b and 34c, as well as light-shielding layers 35 formed thereon.

Common electrodes for the respective arrays of light-receiving devices are supplied with voltages of VB1, VB2 and VB3. The wiring from the thin-film transistors (TFT) 12' in the charge transfer portion 12a connected to the array of light-receiving devices 11a in the first row is connected to the thin-film transistors connecting to the arrays 11b and 11c of light-receiving devices in the second and third rows, whereby it is connected to the common multilevel wiring 13 in a matrix form and, thence, to the common signal lines 14 which are as many as the light-receiving devices 11' in one block. The gate electrodes of thin-film transistors between arrays of light-receiving devices 11 are interconnected in blocks and three groups of gate terminals, GR1–GRN, GG1–GGN, and GB1–GBN, are provided for all blocks.

The specific construction of the color image sensor according to the embodiment under consideration is described below.

Figure 2A:
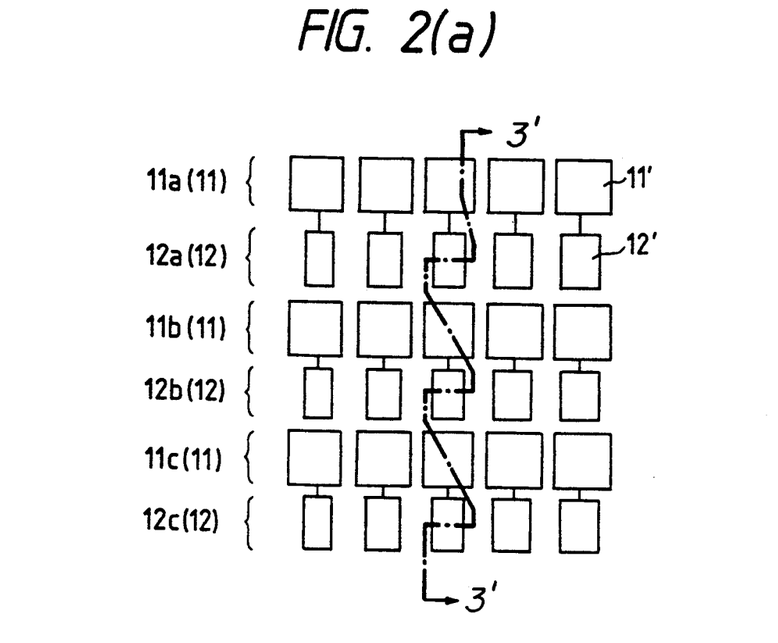
FIG. 2(a) is a schematic plan view of the sensor portion of the system shown in FIG. 1.
Figure 2B:
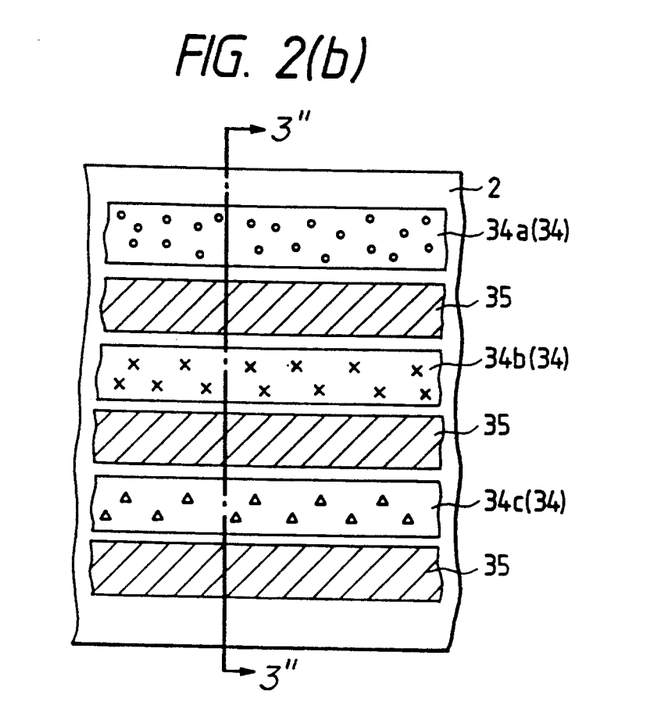
FIG. 2(b) is a schematic plan view of the color filter and light-shielding layer portions of the system shown in FIG. 1.
Figure 3A:
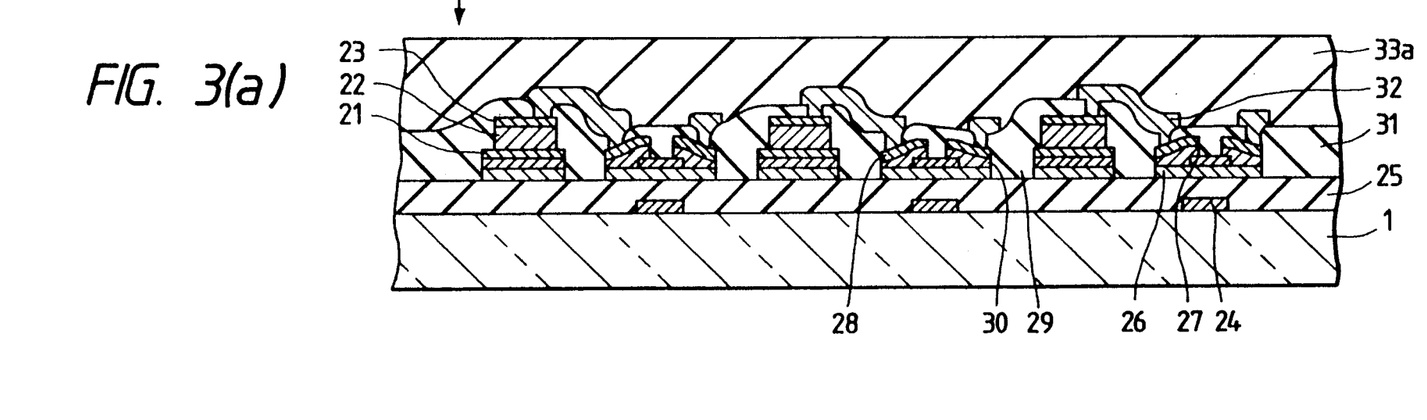
FIG. 3(a) is a cross-sectional explanatory view of FIG. 2(a) on line A—A'.
Figure 3B:
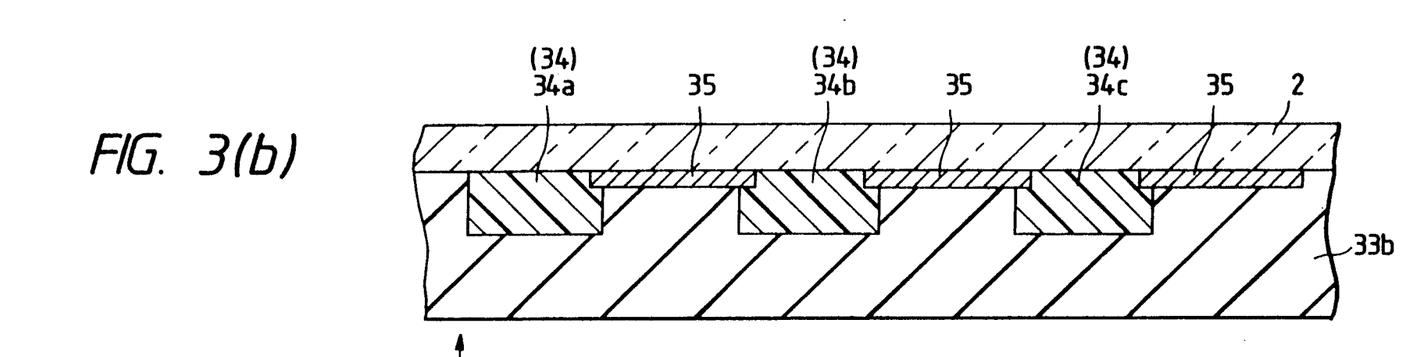
FIG. 3(b) is a cross-sectional explanatory view of FIG. 2(b) taken on line B—B'.

FIGS. 2(a) and 2(b) show in schematic plan views the relationship between substrates 1 and 2. Specifically, FIG. 2(a) is a schematic plan view of the substrate 1 for the sensor portion, and FIG. 2(b) is a schematic plan view of the substrate 2 for the filter portion. FIGS. 3(a) and 3(b) show in cross-sectional explanatory views the relationship between substrates 1 and 2. Specifically, FIG. 3(a) is a cross-sectional explanatory view of FIG. 2(a) taken on line A—A', and FIG. 3(b) is a cross-sectional explanatory view of FIG. 2(b) taken on line B—B'.

As is clear from FIG. 2(a) and FIG. 3(a), each of the light-receiving devices 11' consists of a metallic electrode 21, a photoconductive layer 22 and a transparent electrode 23 that are formed in superposition on the substrate 1 to compose a sandwich structure. The metallic electrode 21 serves as a lower common electrode and is made of chromium (Cr) or the like in strip form; the photoconductive layer 22 is made of hydrogenated amorphous silicon (a-Si:H) segmented for each light-receiving device 11'; and the transparent electrode 23 is an upper electrode that is made of similarly segmented indium tin oxide (ITO).

The lower metallic electrode 21 is formed as a strip in the main scanning direction; discrete segments of photoconductive layer 22 are formed on the metallic electrode 21; the upper transparent electrode 23 is similarly segmented to form separate electrodes. As a result, the portion held between the metallic electrode 21 and the transparent electrode 23 provides an individual light-receiving device 11' and a plurality of such light-receiving devices 11' form an array of light-receiving devices 11. Such arrays 11 are arranged in three rows in the subsidiary scanning direction.

Each of the thin-film transistors 12' which compose the charge transfer portions 12 comprises a gate electrode 24, a gate insulating layer 25, a semiconductor active layer 26, a channel protective layer 27, an ohmic contact layer 30, and a drain electrode 28 and a source electrode 29 that are formed in superposition on the substrate 1. The gate electrode 24 is formed of a chromium (Cr1) layer; the gate insulating layer 25 is a silicon nitride film; the semiconductor active layer 26 is a hydrogenated amorphous silicon (a-Si:H) layer; the channel protective layer 27 is a silicon nitride film provided in such a way as to be in registry with the gate electrode 24; the ohmic contact layer 30 is an n+hydrogenated amorphous silicon (n+a-Si:H) layer; and the drain electrode 28 and the source electrode 29 are each a chromium (Cr2) layer. On top of the drain and source electrodes, a wiring layer 32 made of aluminum or the like is connected via an inter-level insulating layer 31 made of polyimide or the like, thus forming a reverse-staggered transistor.

The charge transfer portions 12 are also arranged in three row, 12a, 12b and 12c, parallel to the main scanning direction in correspondence with the respective arrays of light-receiving devices 11. Thus, the arrays of light-receiving devices 11 alternate with the arrays of charge transfer portions 12.

The entire surface of the substrate 1 having the necessary films and layers is covered with a passivation layer 33a made of polyimide or the like, which is patterned in such a way that the wiring layer 32 is partly exposed at an end of the substrate 1. The wiring drawn from the exposed part of the wiring layer 32 is grounded for a constant potential.

As shown in FIG. 2(b) and FIG. 3(b), the other transparent insulating substrate 2 has formed thereon a plurality of color filters 34 for performing color separation on the reflected light from the document surface and a plurality of light-shielding layers 35 for shielding the thin-film transistors 12' from light. The color filters are designed and formed on the substrate 2 in such a way that different arrays of light-receiving devices will respond to light in different wavelength regions; specifically, the red filter 34a is disposed on top of the array 11a, the green filter 34b on top of the array 11b, and the blue filter 34c on top of the array 11c. In other words, the respective color filters 34 are formed in the main scanning direction as strips that have comparable widths and lengths to the individual arrays of light-receiving devices 11 so that they cover the latter; the color filters 34a, 34b and 34c are arranged in a three-color stripe pattern.

Light-shielding layers 35 are formed on the substrate 2 in positions that correspond to the top of the charge transfer portions 12 on the substrate 1. The light-shielding layers 35 are metallic layers made of chromium (Cr) or the like and the surface of each light-shielding layer that is in registry with the corresponding thin-film transistor 12' has its reflectance lowered ($\leq 15\%$) by forming chromium oxide ($Cr_2O_3$) on pure chromium. The light-shielding layers 35 are formed as strips in the main scanning direction that are wide enough (100–200 $\mu m$) to cover the channel portions of the respective thin-film transistors 12' and that have a comparable length to the charge transfer portions 12; the respective light-shielding layers 35 are disposed over the corresponding charge transfer portions 12a, 12b and 12c. Thus, the color filters 34 alternate with the light-shielding layers 35 to form a stripe pattern on the substrate 2.

The low-reflectance ($\leq 15\%$) surface provided on that side of each light-shielding layer 35 which faces the corresponding thin-film transistor 12' insures that the light coming from the lateral side will not be reflected toward the thin-film transistor 12' and this helps improve the switching characteristics of the thin-film transistors 12'. Furthermore, the surface of each light-shielding layer 35 that is on the side facing the thin-film transistor 12' is rendered to have low reflectance by overlying the pure chromium part of the light-shielding layer 35 with a chromium oxide film; in this way, the low-reflectance surface of each light-shielding layer 35 can be easily formed.

The light-shielding layers 35 are interconnected in a common wiring at an end of the substrate 2, from which they are further connected to a constant potential. The entire surface of the substrate 2 having the necessary filters and layers is covered with a passivation layer 33b made of polyimide or the like, which is patterned in such a way that the light-shielding layers 35 are partly exposed in the areas where they are connected to a constant potential.

The substrates 1 and 2 are bonded into registry with each other so that the red filter 34a, green filter 34b and blue filter 34c are located above the arrays of light-receiving devices 11a, 11b and 11c, respectively, while at the same time the light-shielding layers 35 are located above the associated charge transfer portions 12. The bonding of the substrates 1 and 2 is mostly achieved by an insulating adhesive 36 (see FIG. 4) of an epoxy or other type and only at the end of each substrate which is free of the passivation layers 33 is to be used an electroconductive adhesive 37 (also see FIG. 4).

Figure 4:
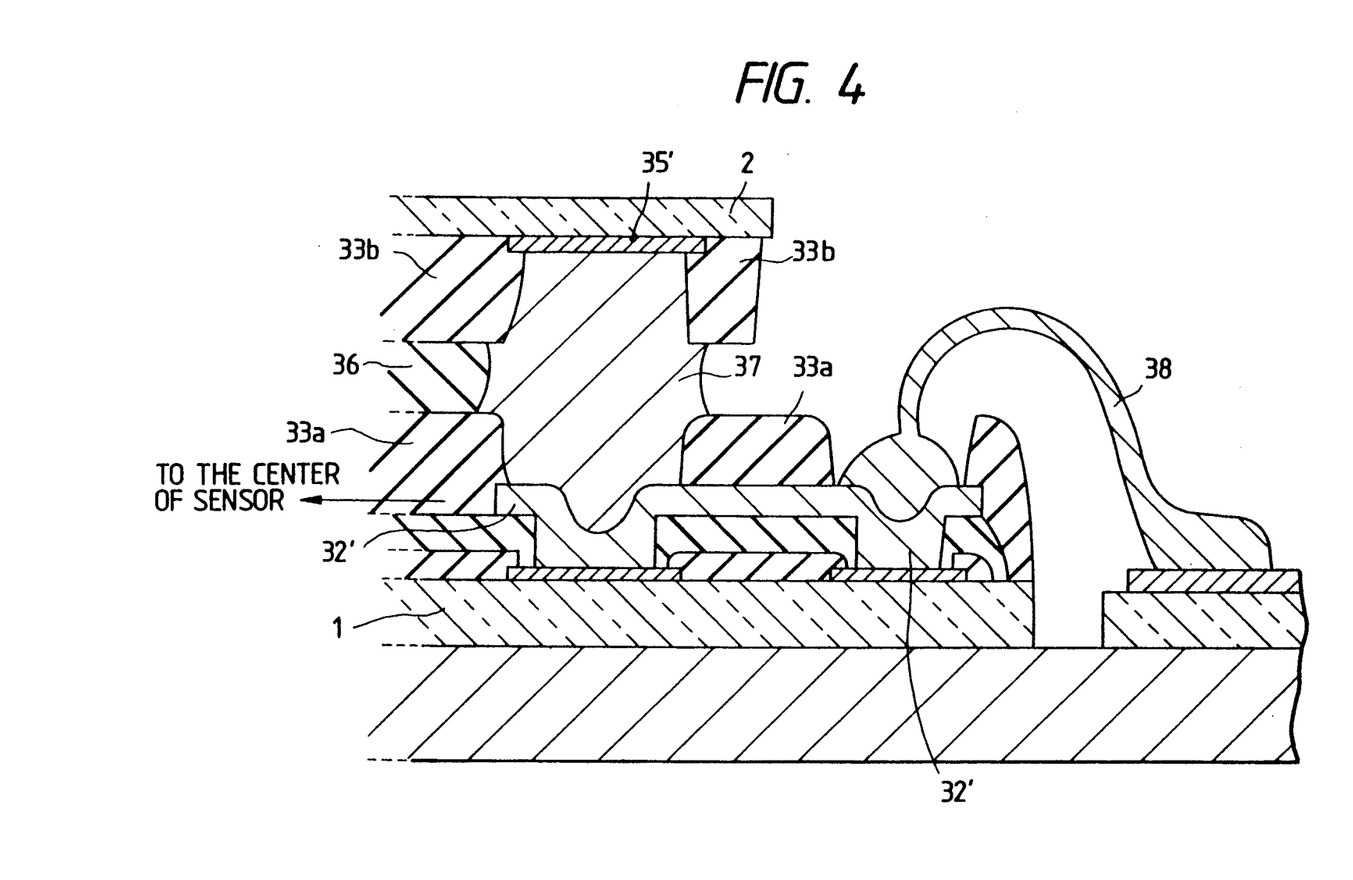
FIG. 4 is a cross-sectional explanatory view showing the bonded area of the color image sensor shown in FIG. 1.

Now, the end of substrates 1 and 2 at which they are bonded together will be described below with reference to the cross-sectional explanatory view of FIG. 4.

The metallic layer 35' extending from each of the light-shielding layers 35 on the substrate 2 is connected to the metallic layer 32' on the substrate 1 via the electroconductive adhesive 37, while metallic layer 32' in turn is connected to an external circuit by wire bonding 38 or the like and grounded for a constant potential. The light-shielding layers 35 are thus grounded in order to prevent their potential from readily varying in response to potential variations that occur as a result of switching or other operations of the image sensor, thereby insuring that possible variations in the potential of the light-shielding layers will not work as noise which adversely affects the sensor operation.

The color image sensor having the construction described above is operated in the following way: the light issuing from a light source (not shown) is reflected by the document surface (not shown); when the reflected light passes through the red, green and blue filters 34a, 34b and 34c, only the light of specific wavelength components that are determined by the colors of the respective filters are picked up to reach the working portions of the light-receiving devices 11', where electric charges are generated in amounts that depend on the illuminance of received light. As the thin-film transistors 12' are turned on or off, image information for red, green and blue colors are read sequentially. Image signals for individual colors are stored temporarily in a memory external to the sensor and the distances between individual arrays of light-receiving devices are calculated to synthesize image data.

The color image sensor according to the embodiment under consideration can be fabricated by the process which will be described below.

First, a chromium (Cr1) layer is deposited in a thickness of ca. 750 angstroms on the substrate 1 (e.g. glass) by DC sputtering and patterned by photolithographic etching to form the gate electrode 24.

After cleaning, a silicon nitride (SiNx) film, an a-Si:H film and another SiNx film are superposed by plasma-assisted CVD process on the Cr1 pattern in respective thicknesses of ca. 2900, 500 and 1500 angstroms, thereby forming the gate insulating layer 25 of each thin-film transistor 12', the overlying semiconductor active layer 26 and the channel protective layer 27. The upper SiNx film is etched by photolithographic etching to form the patterned channel protective layer 27.

In the next step, an n+ hydrogenated amorphous silicon (n+a-Si:H) film serving as the ohmic contact layer 30 is deposited in a thickness of ca. 1000 angstroms by plasma-assisted CVD process. Furthermore, a chromium (Cr2) layer serving both as each of the drain electrode 28 and the source electrode 29 of each thin-film transistor and as the lower metallic electrode 21 of each light-receiving device 11' is deposited in a thickness of ca. 1500 angstroms by DC magnetron sputtering; and an a-Si:H film serving as the photoconductive layer 22 of each light-receiving device 11' is deposited in a thickness of ca. 13,000 angstroms by plasma-assisted CVD process; and an ITO film serving as the transparent electrode 23 of each light-receiving device 11' is deposited in a thickness of ca. 600 angstroms by DC magnetron sputtering.

Thereafter, the ITO film is patterned by photolithographic etching in order to form the transparent electrode 23 of each light-receiving device 11'. Furthermore, with the same resist pattern being used as a mask, the a-Si:H film serving as the photoconductive layer 22 is patterned by dry etching. Subsequently, the Cr2 film forming the chromium layer for the metallic electrode 21 of each light-receiving device 11', as well as the chromium layer for the drain electrode 28 and source electrode 29 of each TFT is patterned by photolithographic etching; using the same resist pattern, the n+ a-Si:H film forming the ohmic contact layer 29 of each TFT is etched.

In the next step, the lower SiNx film is patterned by photolithographic etching in order to form the gate insulating layer 25 of each TFT. Then, a polyimide film serving as the inter-level insulating layer 31 is coated in a thickness of ca. 11500 angstroms in such a way as to cover the whole area of the image sensor, and contact holes are formed by photolithographic etching. Subsequently, an aluminum (Al) film is deposited in a thickness of ca. 15,000 angstroms by DC magnetron sputtering and patterned in a desired form by photolithographic etching to form the wiring layer 32.

Thereafter, a polyimide film is coated, patterned by photolithographic etching and baked to form the passivation layer 33a. In this step, a contact area is formed that permits the grounded metallic layer 32' on the substrate 1 to be connected to the metallic layer 35' which is drawn from the light-shielding layers 35 on the substrate 2. This completes the formation of the sensor portion on the substrate 1.

In the next step, a chromium (Cr3) film serving as the light-shielding layer 35 is deposited in a thickness of ca. 500 to 2000 angstroms on the other transparent insulating substrate 2 by DC magnetron sputtering. In this step, a pure chromium film is first deposited in a thickness of ca. 400 to 1500 angstroms and, subsequently, a chromium oxide ($Cr_2O_3$) film is deposited in an oxidizing atmosphere by sputtering to give a thickness of ca. 100 to 500 angstroms.

Then, the Cr3 film is patterned by photolithographic etching in three strips that cover the charge transfer portions 12a, 12b and 12c which are arrays of the thin-film transistors (TFT) 12' formed on the substrate 1 in the main scanning direction, whereby the light-shielding layers 35 are formed. It should be noted here that the light-shielding layers 35 are interconnected in such a way that they meet together at the end of the substrate 2, from which the metallic layer 35' is drawn.

Alternatively, the light-shielding layers 35 may be formed by a process that comprises depositing a Cr film in a thickness of ca. 500 to 2000 angstroms by DC magnetron sputtering, then patterning the deposited film in a desired form by photolithographic etching, and performing anodic oxidation or exposing the patterned film to an $O_2$ plasma, thereby oxidizing the film to a depth of ca. 100 to 500 angstroms from the surface.

Then, an organic pigment is dispersed in a clear photosensitive resin to prepare a light-sensitive solution, which is coated, exposed to light and developed in the same manner as is the resist in the usual practice of photolithography, whereby the film is patterned in strips that cover the arrays of light-receiving devices 11 on the substrate 1 so as to form color filters 34 (this method may be referred to as an "organic pigment dispersion technique"). The spectral characteristics of the respective filters can be controlled by changing the kind of organic pigment to be dispersed or adjusting its quantity to be used. In the embodiment under consideration, three types of color filters 34 are formed that transmit light in the red, green and blue wavelength regions so that the arrays 11a, 11b and 11c of light-receiving devices will generate electric charges in response to red, green and blue light, respectively.

In the next step, a polyimide or other film serving as the assivation layer 33b is deposited in a thickness of ca. 1 to 2 μm, baked and, thereafter, patterned in such a way that part of the Cr3 film is exposed. As a result, a contact area is formed that permits the metallic layer 35' continuous from the light-shielding layers 35 to be connected to the metallic layer 32' on the substrate 1.

Subsequently, the substrate 1 is bonded to the substrate 2 with an adhesive that may be insulating or electroconductive. For the greater part of the areas on the substrates, an insulating adhesive 36 of an epoxy or other type is used, whereas a conductive adhesive 37 is used in the contact area for grounding the light-shielding layers. Using these two types of adhesive, the substrates 1 and 2 are bonded and the metallic layer 35' formed on the substrate 2 conducts to the metallic layer 32' formed on the substrate 1, with the metallic layer 32' being grounded through connection to an external circuit by wire bonding 38. This step completes the process of fabricating the color image sensor.

As described above, the color image sensor according to the embodiment under consideration is of such a structure that the substrate 1 on which the sensor portion is formed and the substrate 2 on which the color filters 34 and the light-shielding layers 35 for shielding the thin-film transistors 12' from light are formed, are bonded in registry with each other. Because of this feature, the channel portions of the thin-film transistors can be shielded from light without increasing the complexity of the layout of metallic wirings and other system components on the substrate 1, which contributes to an improvement of the switching characteristics of the thin-film transistors.

Providing the light-shielding layers 35 on the substrate 2 has the advantage of eliminating the light-shielding metallic pattern which has heretofore been necessary and the associated interconnections. This not only provides ease in designing the layout of the sensor portion, it also reduces the overall area of the sensor and, hence, the production cost of the sensor.

In the conventional color image sensors, light-shielding metallic layers are formed such a Way only the inter-level insulating layer 31 exists between the light-shielding layer and each of the drain electrode 28 and source electrode 29 of the thin-film transistor, and this has been a cause of the development of stray capacitance. However, in accordance with the present invention, the occurrence of such stray capacitance can be reduced to a satisfactory small level. Hence, there is no need to design the sensor with undesired capacitance taken into account and, at the same time, one can prevent the sensitivity from decreasing on account of a lower output to the common signal lines.

Furthermore, the formation of the light-shielding layers 35 from metal is effective in preventing the entrance of electric noise from outside the image sensor. The low-reflectance surface of each light-shielding layer 35 which is on the side facing the corresponding thin-film transistor insures that the light coming from the lateral side will not be reflected toward the thin-film transistors and, hence, the surface is effective in improving the switching characteristics of those thin-film transistors. In addition, the low-reflectance surface which is formed of a chromium oxide has the advantage of easy formability.

If necessary, the light-shielding metallic layers may be enlarged so that they cover not only the areas corresponding to the thin-film transistors but also the areas above the multilevel wiring 13 in a matrix form. This structural modification will provide greater effectiveness in preventing the occurrence of noise in the multilevel wiring portion, thereby enhancing the reliability of the image sensor.

Figure 5:
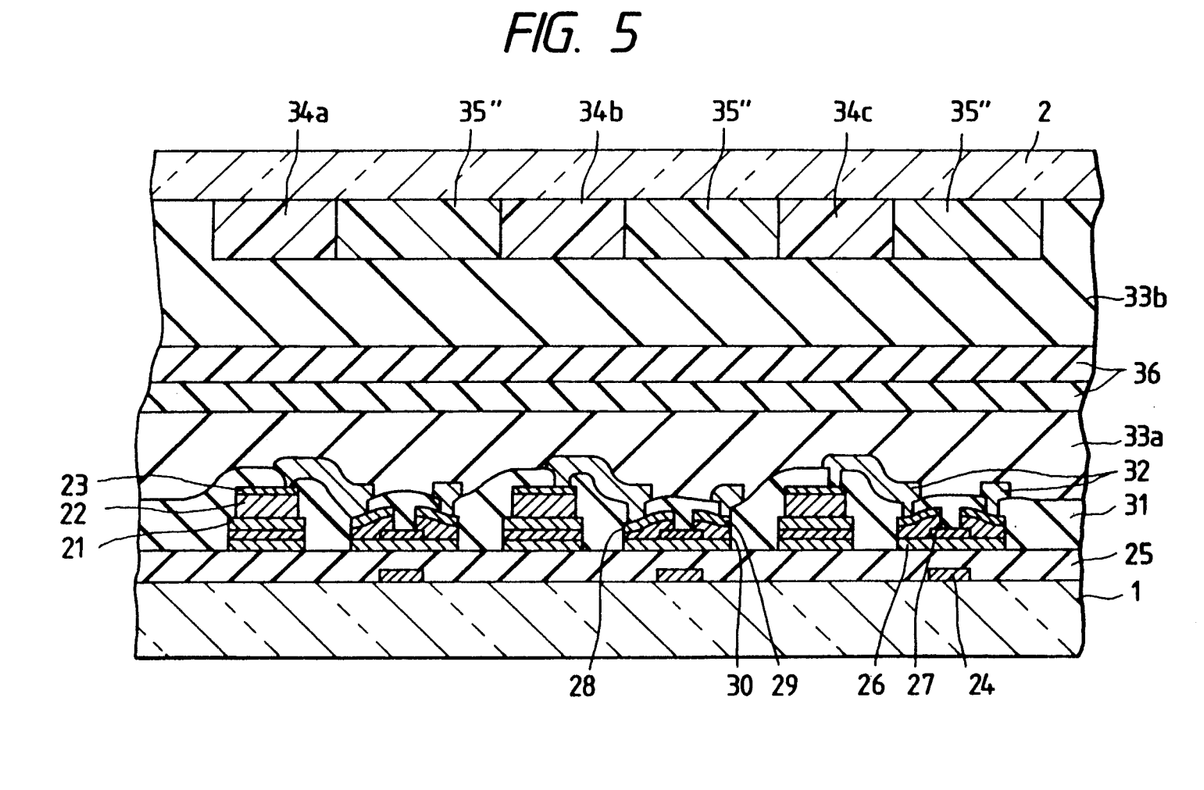
FIG. 5 is a cross-sectional explanatory view of a color image sensor according to another embodiment of the present invention.

In the embodiment described above, the light-shielding layers 35 are formed of a metal. In another embodiment, the light-shielding layers may be made of the same material as that of the color filters (see the cross-sectional explanatory view of FIG. 5). The light-shielding layers designated by reference numeral 35" in FIG. 5 are formed in the same step as the formation of color filters on the substrate 2: a black pigment is dispersed in the same photosensitive resin as the material of which the color filters 34 are made, thereby preparing a light-sensitive solution, which is coated, exposed to light and developed so that the coating is patterned in a desired form. Thus, light-shielding layers 35" can be formed as black filters of the same material as the red, green and blue filters in the same step as the formation of those filters and this offers the advantage of forming the light-shielding layers in a simple way without adding a new step.

The color image sensor according to the embodiment shown in FIG. 5 differs from the sensor of the embodiment shown in FIGS. 2 and 3 in that the light-shielding layers 35" are not made of a metal such as Cr and this obviates the need for keeping those light-shielded layers at a constant potential. Hence, connections such as one to the ground can be eliminated to realize a simplified configuration. Another feature of the embodiment shown in FIG. 5 is that the substrates 1 and 2 are bonded by means of an insulating adhesive 36 alone.

Furthermore, the light-shielding layers 35' formed as black filters are capable of light absorption, so they absorb not only the light incident from the upper side but also the light coming from the lateral side, thus preventing the entrance of light into the thin-film transistors and accomplishing highly effective light shielding.

As in the first embodiment, the color image sensor of the second embodiment has such a structure that the light-shielding layers are formed on a different substrate than the one on which the sensor portion is formed and to which the substrate is to be bonded. This helps prevent the increase in the complexity of the layout of wirings and other system components and yet the switching characteristics of the thin-film transistors can be improved to enhance the reliability of the image sensor.

According to the invention, color filters are formed on the insulating layer in such positions that they cover the light-receiving devices formed on the substrate whereas light-shielding layers are formed on the insulating layers in such positions that they cover the thin-film transistors also formed on the substrate. Because of this arrangement, the following advantages are obtained: the color filters and the light-shielding layers can be formed on wirings and other system components via the insulating layer and the channel portion of each thin-film transistor can be shielded from light without increasing the complexity of the layout of wirings and other system components. Furthermore, the thin-film transistors and the light-shielding layers can be held apart by a sufficient distance to reduce the stray capacitance in the thin-film transistors, thereby improving their switching characteristics and enhancing the reliability of the color image sensor.

What is claimed is:

1. A color image sensor comprising:
   a substrate;
   light-receiving devices on said substrate;
   thin-film transistors on said substrate and connected to said light-receiving devices;
   an insulating layer covering said thin-film transistors and said light-receiving devices;
   a color filter on said insulating layer covering said light-receiving devices; and
   a light-shielding layer on said insulating layer covering said thin-film transistors.

2. The color image sensor according to claim 1, wherein said light-shielding layer has a surface of low reflectance on a side facing said thin-film transistors.

3. A color image sensor comprising:
   a first substrate;
   light-receiving devices on said first substrate;
   thin-film transistors on said first substrate and connected to said light-receiving devices;
   a second substrate;
   a color filter on said second substrate covering said light-receiving devices;
   a light-shielding layer on said second substrate covering said thin-film transistors; and
   an adhesive layer between said first substrate and said second substrate.

4. The color image sensor according to claim 3, wherein said light-shielding layer has a surface of low reflectance on a side facing said thin-film transistors whereby said surface of low reflectance prevents light from being reflected toward said thin-film transistors from a lateral side of said light-shielding layer.

5. The color image sensor according to claim 4, wherein said light-shielding layer is a metallic material and said surface of low reflectance of said light-shielding layer is an axide of said metallic material.

6. The color image sensor according to claim 3, wherein said light-shielding layer is an electroconductive material and has means for keeping said light-shielding layer at a constant potential.

7. The color image sensor according to claim 3, wherein said light-shielding layer is a material having a black pigment dispersed in a same photosensitive resin as said color filter.

8. A color image sensor comprising:
   a substrate;
   light-receiving devices on said substrate;
   thin-film transistors on said substrate and connected to said light-receiving devices;
   an insulating layer covering said thin-film transistors and said light-receiving devices;
   a color filter on said insulating layer covering said light-receiving devices;
   a light-shielding layer on said insulating layer covering said thin-film transistors and overlapping said color filter.

9. A color image sensor comprising:
   a substrate;
   light-receiving devices on said substrate;
   thin-film transistors on said substrate and connected to said light-receiving devices;
   an insulating layer covering said thin-film transistors and said light-receiving devices;
   a color filter on said insulating layer covering said light-receiving devices;
   a light-shielding layer on said insulating layer covering said thin-film transistors and contacting said color filer.

* * * * *

UNITED STATES PATENT AND TRADEMARK OFFICE
CERTIFICATE OF CORRECTION

PATENT NO. : 5,274,250
DATED : December 28, 1993
INVENTOR(S) : Hiroyuki Miyake et al.

It is certified that error appears in the above-indentified patent and that said Letters Patent is hereby corrected as shown below:

Claim 5, column 11, line 25, change "axide" to --oxide--.

Claim 9, column 12, last line , change "filer" to --filter--.

Signed and Sealed this

Thirtieth Day of August, 1994

Attest:

BRUCE LEHMAN

*Attesting Officer*   *Commissioner of Patents and Trademarks*